(12) United States Patent
Kimball et al.

(10) Patent No.: US 7,867,355 B2
(45) Date of Patent: Jan. 11, 2011

(54) ADJUSTABLE HEIGHT PIF PROBE

(75) Inventors: Christopher Kimball, Fremont, CA (US); Eric Hudson, Berkeley, CA (US); Douglas Keil, Fremont, CA (US); Alexei Marakhtanov, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 208 days.

(21) Appl. No.: 12/333,209

(22) Filed: Dec. 11, 2008

(65) Prior Publication Data

US 2009/0133836 A1 May 28, 2009

Related U.S. Application Data

(62) Division of application No. 11/377,074, filed on Mar. 15, 2006, now Pat. No. 7,479,207.

(51) Int. Cl.
*C23F 1/02* (2006.01)
*C23C 16/00* (2006.01)

(52) U.S. Cl. .............. 156/345.28; 156/345.25; 156/345.24; 156/345.3; 156/345.15; 118/723 IR; 118/723 I; 118/723 ER; 118/723 E

(58) Field of Classification Search ............ 156/345.24, 156/345.25, 345.34, 345.3, 345.15, 345.28, 156/345.44, 345.47; 118/723 IR, 723 I, 723 ER, 118/723 E, 720, 721, 715; 315/111.71, 111.41, 315/111.21
See application file for complete search history.

(56) References Cited

U.S. PATENT DOCUMENTS

| | | | |
|---|---|---|---|
| 5,471,115 A | 11/1995 | Hikosaka | |
| 5,705,931 A | 1/1998 | Klick | |
| 5,936,413 A | 8/1999 | Booth et al. | |
| 7,192,505 B2 | 3/2007 | Roche et al. | |
| 2003/0227283 A1 | 12/2003 | Cox et al. | |
| 2007/0284246 A1 | 12/2007 | Keil et al. | |
| 2010/0132890 A1* | 6/2010 | Mizukami et al. | 156/345.28 |

FOREIGN PATENT DOCUMENTS

| | | |
|---|---|---|
| EP | 07925771 B1 | 12/1999 |
| FR | 2738984 A1 | 3/1997 |
| WO | WO97/11587 | 3/1997 |

OTHER PUBLICATIONS

N. St. J. Braithwaite, T. E. Sheridan and R. W. Boswell, "Transient Rf Self-bias in Electropositive and Electronegative Plasmas", J. Phys. D.: Appl. Phys. 36 (2003) pp. 2837-2844.
Jean-Paul Booth, "Diagnostics of Etching Plasmas", Pure Appl. Chem., vol. 74, No. 3 (2002) pp. 397-400.
N. St. J. Braithwaite, J. P. Booth and G. Cunge, "A Novel Electrostatic Probe Method for Ion Flux Measurements", Plasma Sources Sci. Technol. 5 (1996) pp. 677-684.
J. P. Booth, N. St. J. Braithwaite, A. Goodyear, and P. Barroy, "Measurements of Characteristic Transients of Planar Electrostatic Probes in Cold Plasmas", Rev. Sci. Instrum., vol. 71, No. 7 (2000) pp. 2722-2727.
Office Action dated May 13, 2008 in U.S. Appl. No. 11/377,074.
Notice of Allowance dated Sep. 15, 2008 in U.S. Appl. No. 11/377,074.

* cited by examiner

*Primary Examiner*—Tuyet Thi Vo
(74) *Attorney, Agent, or Firm*—Beyer Law Group LLP

(57) ABSTRACT

A plasma probe assembly for use in a plasma processing chamber is provided. A semiconductor probe element with a probe surface at a first end of the semiconductor probe element is provided. An electrical connector is electrically connected to the semiconductor probe element. An electrically insulating sleeve surrounds at least part of the probe element. An adjustment device is connected to the semiconductor probe so that the probe surface is coplanar with an interior chamber surface of the plasma processing chamber.

20 Claims, 6 Drawing Sheets

ADJUSTABLE HEIGHT PIF PROBE

CROSS REFERENCE TO RELATED APPLICATIONS

This application is a divisional of prior U.S. patent application Ser. No. 11/377,074, entitled "Adjustable Height PIF Probe", filed on Mar. 15, 2006, by inventors Kimball et al., which is incorporated herein by reference and from which priority under 35 U.S.C. §120 is claimed.

BACKGROUND OF THE INVENTION

The present invention relates in general to substrate manufacturing technologies and in particular to an apparatus for measuring a set of electrical characteristics in a plasma.

In the processing of a substrate, e.g., a semiconductor wafer, MEMS device, or a glass panel such as one used in flat panel display manufacturing, plasma is often employed. As part of the processing of a substrate (chemical vapor deposition, plasma enhanced chemical vapor deposition, physical vapor deposition, etch, etc.) for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck. Appropriate etchant source gases (e.g., $C_4F_8$, $C_4F_6$, $CHF_3$, $CH_2F_3$, $CF_4$, $CH_3F$, $C_2F_4$, $N_2$, $O_2$, $Ar$, $Xe$, $He$, $H_2$, $NH_3$, $SF_6$, $BC_{13}$, $C_{12}$, etc.) are then flowed into the chamber and struck to form a plasma to etch exposed areas of the substrate.

Subsequently, it is often beneficial to measure the electrical characteristics in a plasma (i.e., ion saturation current, electron temperature, floating potential, etc.) in order to ensure consistent plasma processing results. Examples may include detecting the endpoint of a chamber conditioning process, chamber matching (e.g., looking for differences between chambers which should nominally be identical), detecting faults and problems in the chamber, etc.

In view of the foregoing, there are desired apparatus for measuring a set of electrical characteristics in a plasma.

SUMMARY OF THE INVENTION

To achieve the foregoing and in accordance with the purpose of the present invention, a plasma probe assembly for use in a plasma processing chamber is provided. A semiconductor probe element with a probe surface at a first end of the semiconductor probe element is provided. An electrical connector is electrically connected to the semiconductor probe element. An electrically insulating sleeve surrounds at least part of the probe element. An adjustment device is connected to the semiconductor probe so that the probe surface is coplanar with an interior chamber surface of the plasma processing chamber.

In another manifestation of the invention, a plasma probe assembly for use in a plasma processing chamber is provided. A semiconductor probe element with a semiconductor probe surface at a first end of the semiconductor probe element is provided. An electrical connector is electrically connected to a second end of the semiconductor probe element. An electrically insulating sleeve surrounds at least part of the probe element. An adjustment device is connected to the semiconductor probe element to adjust the semiconductor probe element so that the probe surface is coplanar with an interior chamber surface of the plasma processing chamber. A sleeve adjustment device adjusts the electrical insulating sleeve, wherein the electrically insulating sleeve has an external edge and the sleeve adjustment device adjusts the external edge to be coplanar to the probe surface. Sensing electronics is electrically connected to the electrical connector, wherein the sensing electronics comprises an ammeter.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
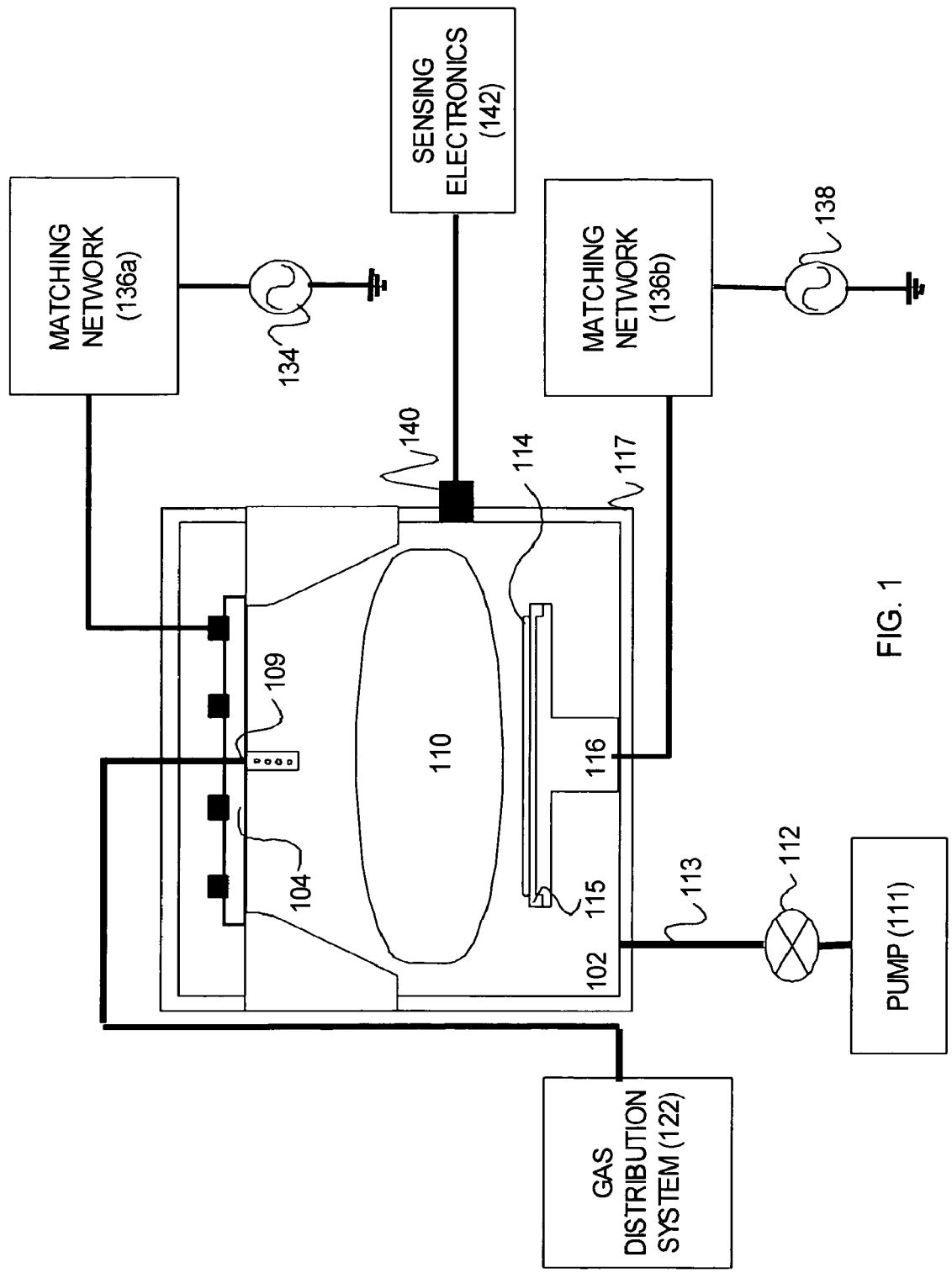
FIG. 1 is a schematic view of a process chamber that uses a plasma probe.

FIG. 1 is a simplified diagram of an inductively coupled plasma processing system in which the inventive plasma ion flux (PIF) probe 140 is used. Generally, an appropriate set of gases may be flowed from gas distribution system 122 into plasma chamber 102 having plasma chamber walls 117. These plasma processing gases may be subsequently ionized at or in a region near injector 109 to form a plasma 110 in order to process (e.g., etch or deposit) exposed areas of substrate 114, such as a semiconductor substrate or a glass pane, positioned with edge ring 115 on an electrostatic chuck 116.

A first RF generator 134 generates the plasma as well as controls the plasma density through an upper electrode 104, while a second RF generator 138 generates bias RF, commonly used to control the DC bias and the ion bombardment energy. Further coupled to source RF generator 134 is matching network 136*a*, and to bias RF generator 138 is matching network 136*b*, that attempt to match the impedances of the RF power sources to that of plasma 110. Furthermore, vacuum system 113, including a valve 112 and a set of pumps 111, is commonly used to evacuate the ambient atmosphere from plasma chamber 102 in order to achieve the required pressure to sustain plasma 110 and/or to remove process byproducts.

The PIF probe 140 is mounted so that a surface of a probe element is coplanar with the interior of the chamber walls 117. Sensing electronics 142 are electrically connected to the PIF probe 140.

Figure 2:
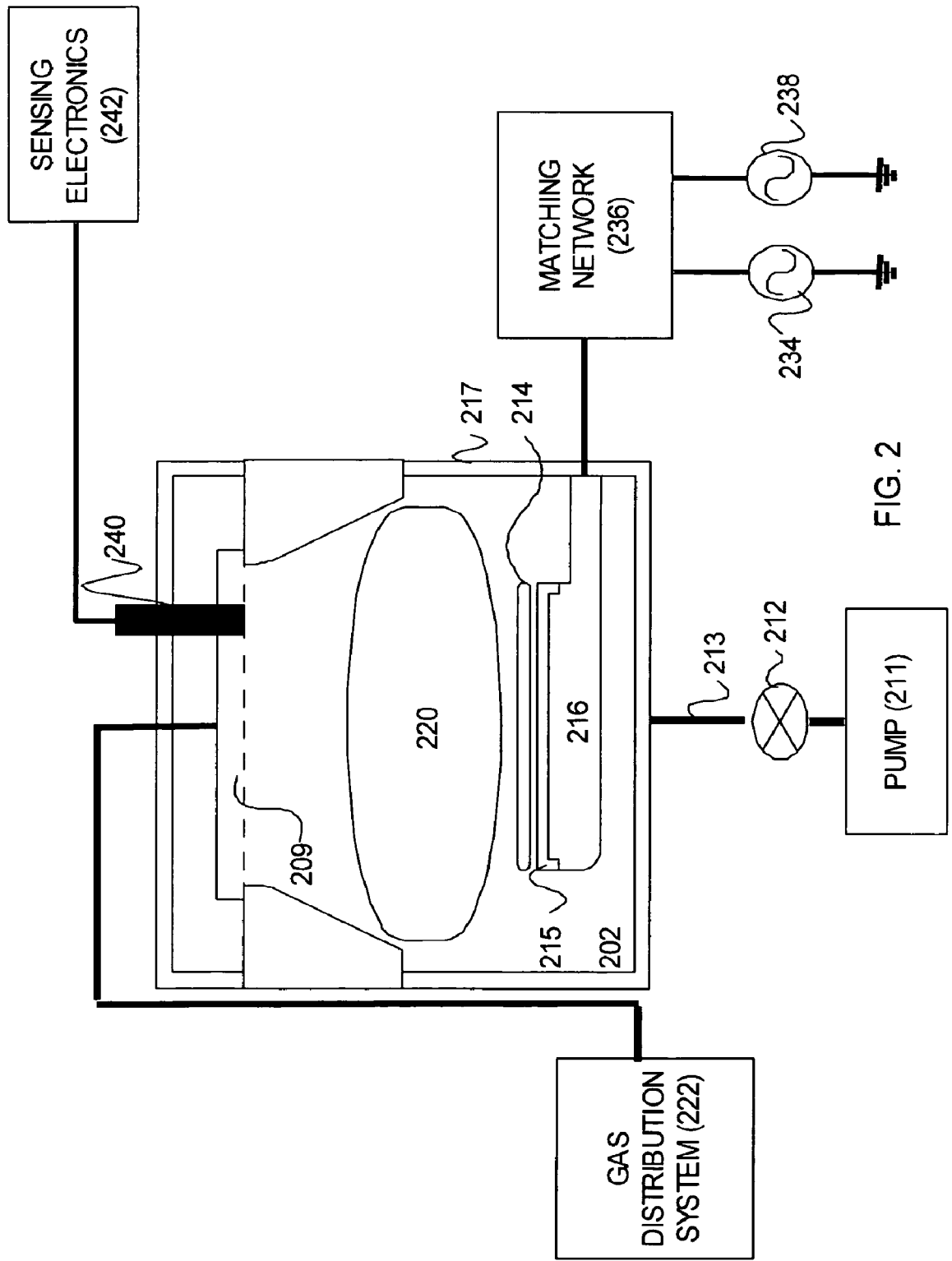
FIG. 2 is a schematic view of another process chamber that uses a plasma probe.

FIG. 2 is a simplified diagram of a capacitively coupled plasma processing system in which the inventive plasma ion flux (PIF) probe 240 is used. Generally, capacitively coupled plasma processing systems may be configured with a single or with multiple separate RF power sources. Source RF, generated by source RF generator 234, is commonly used to generate the plasma as well as control the plasma density via capacitively coupling. Bias RF, generated by bias RF generator 238, is commonly used to control the DC bias and the ion bombardment energy. Further coupled to source RF generator 234 and bias RF generator 238 is matching network 236, which attempts to match the impedance of the RF power sources to that of plasma 220. Other forms of capacitive reactors have the RF power sources and match networks connected to a top electrode 209. In addition, there are multi-anode systems such as a triode that also follow similar RF and electrode arrangements.

Generally, an appropriate set of gases is flowed through an inlet in the top electrode 209 from gas distribution system 222 into plasma chamber 202 having plasma chamber walls 217. These plasma processing gases may be subsequently ionized to form a plasma 220, in order to process (e.g., etch or deposit) exposed areas of substrate 214, such as a semiconductor substrate or a glass pane, positioned with edge ring 215 on an electrostatic chuck 216, which also serves as an electrode. Furthermore, vacuum system 213, including a valve 212 and a set of pumps 211, is commonly used to evacuate the ambient atmosphere from plasma chamber 202 in order to achieve the required pressure to sustain plasma 220.

Figure 3:
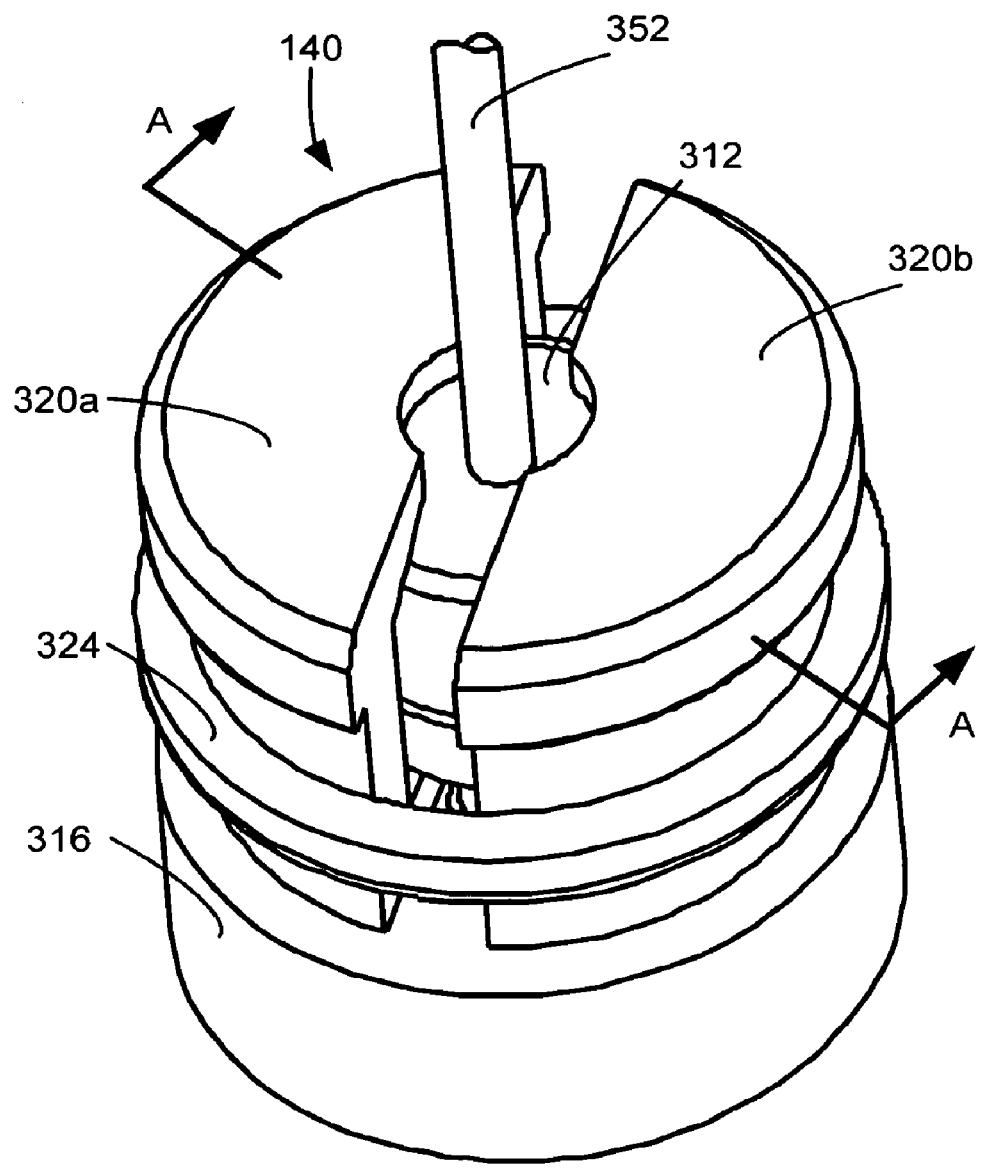
FIG. 3 is a perspective view of a plasma probe.
Figure 4:
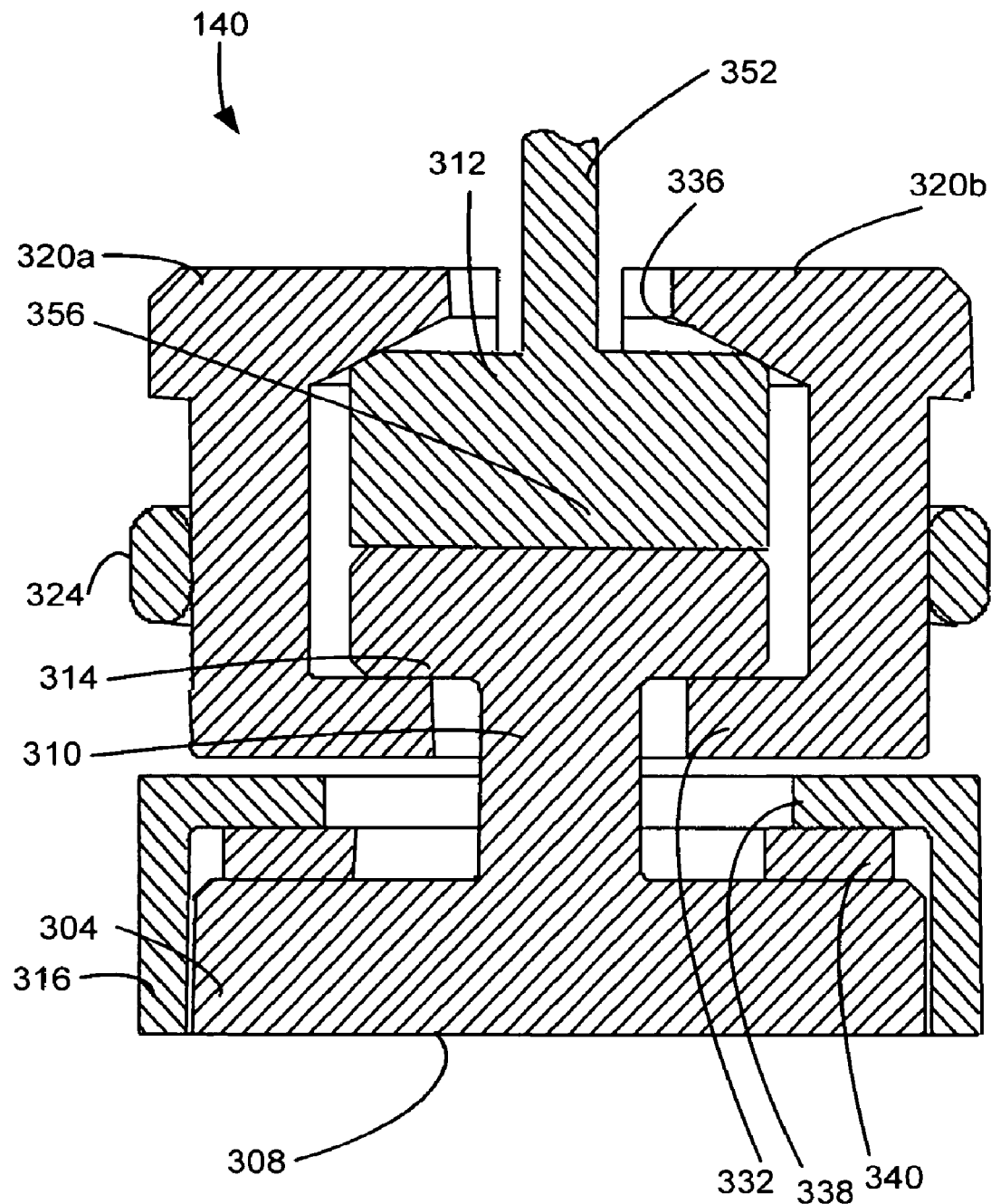
FIG. 4 is a cross-sectional of the plasma probe of FIG. 3 along cut lines A-A.

FIG. 3 is a perspective view of a PIF probe 140 provided by an embodiment of the invention. FIG. 4 is a cross sectional view of the PIF probe 140 of FIG. 3 along cut lines A-A. A silicon probe element 304 provides a probe surface 308 at a first end of the probe element, which is a surface used for plasma detection. An aluminum electrical connector 312 is placed at a second end of the probe element away from the probe surface 308. An electrically insulative sleeve 316 is placed around the first end of the probe element 304. A segmented cover 320 is placed around the second end of the probe element 304 and the electrical connector 312. In this embodiment, the segmented cover 320 has a first half 320a and a second half 320b that are held together by an O-ring 324.

The probe element 304 has a wide first end to provide a wide probe surface 308. A narrower neck 310 connects the first end of the probe element 304 to the second end 314 of the probe element 304. In this embodiment, the back surface of the second end 314 of the probe element 304 is metalized to provide a good electrical contact between the probe element 304 and the aluminum electrical connector 312.

Each of the segment cover halves 320a,b have a first lip 332 for engaging with the second end 314 of the probe element and a second lip 336 for engaging with the electrical connector 312. In this embodiment, the second lip 336 has a beveled surface that engages with the electrical connector 312 at an oblique angle to form an oblique connection, as shown, so that the electrical connector 312 is pressed against the metalized surface of the second end 314 of the probe element 304 as the O-ring 324 presses the segmented cover halves 320a,b together to provide a good electrical contact. In other embodiments, the electrical connector 312 has a beveled surface to create the oblique connection between the second lip and the electrical connector. In other embodiments, the second end 314 of the probe element has an oblique connection with a lip of the segmented cover.

A shaft 352 is connected to the electrical connector 312. The shaft 352 may screw into the electrical connector 312.

The probe element 304 in this embodiment is made of silicon for contamination purposes. Preferably, the probe element is of a material that would be available from other sources during the etch. In addition, it is preferable that the probe element is made of a semiconductor material. In this embodiment, the sleeve 316 is made of quartz. The cover 320 is made over a fluoropolymer.

In assembling the probe 140, at least one spacer 340 is placed around the neck 310 of the probe element 304. The second end 314 of the probe element passes through an aperture with the sleeve 316. A lip 338 formed by the sleeve engages with the spacer 340. The spacers 340 are added or removed until an external edge of the sleeve 316 is about even with the probe surface 308, when the lip is against the spacers 340. It is believed that the quartz sleeve will erode faster than the silicon probe element 304, so initially spacers are desired, so as the sleeve 316 erodes faster spacers may be removed to keep the probe surface about even with the external edge of the sleeve 316.

The electrical connector 312 is placed against the second end 314 of the probe element 304. The segmented cover 320 is placed around the second end 314 of the probe element 304 and the electrical connector 312. O-ring 324 is placed around the segmented cover 320, compressing the segmented cover 320 together, which pushes the electrical connector 312 against the metalized surface of the second end 314 of the probe element 304 to provide a good electrical contact, thus forming the probe 140. The probe 240 may be placed from the inside of the chamber into a probe aperture into which the shaft 352 extends. The shaft 352 may be inserted into a hole in the electrical connector 312, where the shaft 352 and the hole have matching threads. The shaft 352 provides both an electrical contact and mechanical support for the probe 140.

The shaft 352 allows for easy mounting of the probe 140. The shaft 352 may be adjusted or allows adjustment of the probe so that the probe surface 308 and the external edge of the sleeve 316 are substantially coplanar with the chamber surface.

Preferably, the probe surface 308 and the external edge of the sleeve 316 are coplanar to the surface of the chamber. The quartz external edge of the sleeve 316, the probe surface 308, and the upper electrode 104, may be made of different materials, and therefore may wear out or erode at different rates, causing the probe surface 308 or the external edge of the sleeve 316 to not be coplanar with the surface of the chamber.

Figure 5:
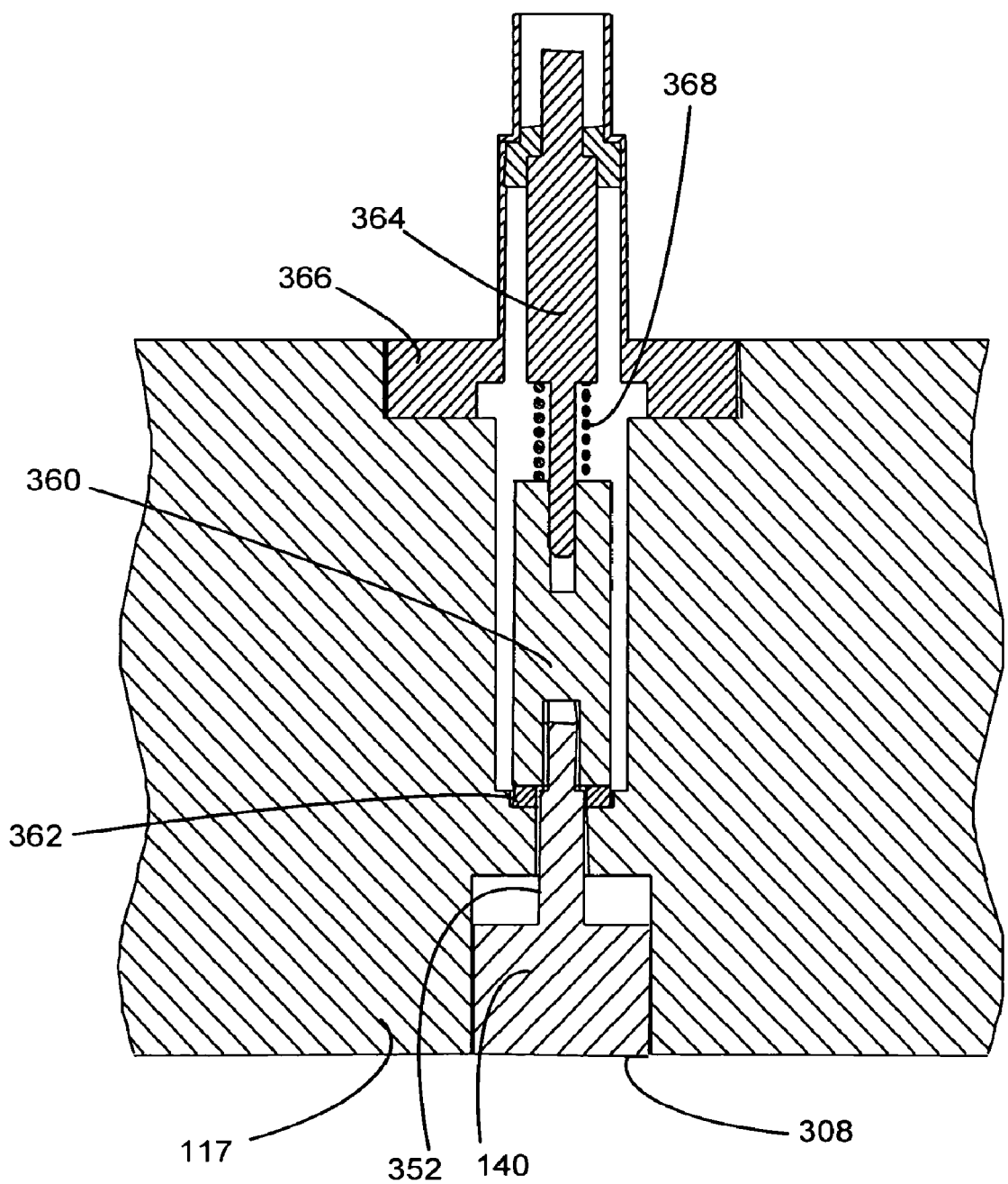
FIG. 5 is an enlarged cross-sectional view of a chamber wall and a probe.

FIG. 5 is an enlarged cross-sectional view of a chamber wall 117 and a probe 140. The shaft 352 extends from the probe 140 and is connected to a first end of a shaft holder 360. A second end of the shaft holder is connected to a first end of an electrical vacuum feed through 364. The grounded part of the feed through 366 is secured the backside of the chamber wall 117. A spring 368 between the feed through 364 and the shaft holder 360 maintains the force required for good thermal contact between the chamber wall 117 and the shaft holder 360. The shaft holder 360 is electrically insulated from the chamber wall 117 by an electrically insulating and thermally conducting material 362. Such materials include, but are not limited to, aluminum nitride, aluminum oxide, silicon nitride, boron nitride, and polymers filled with these ceramics.

In operation, a screwdriver, wrench, or other drive device may be used to rotate the shaft holder 360 which is threaded onto the probe shaft 352. This operation is done with the electrical feed through 364 removed. Depending on the rotation of the shaft holder 360, the probe shaft 352 and probe 140 are slid either towards or away from the shaft holder 360 and the back side of the chamber wall 117, allowing the probe surface 308 to be adjusted with respect to the inner surface of the chamber wall 117.

The ability to adjust the probe and sleeve independently allows the probe to be mounted inside the chamber for easier adjustability. If the quartz sleeve 316 is eroded faster than the probe element 304, after significant erosion of the quartz sleeve 316, a spacer 340 may be removed so that the external edge of the quartz sleeve 316 is about coplanar with the probe surface 308.

In operation, the probe 140 measures the plasma by measuring the current at the probe surface. The current may flow from the probe surface through the probe element to the electrical connector and then to the support shaft to the sensing electronics. Therefore, the sensing electronics comprises a device for measuring and recording current, such as an ammeter. The plasma causes etching of the external edge of the sleeve and the probe surface of the probe element. If the external edge is etched faster, so that the external edge is etched further than the probe surface, the probe is removed and then a spacer is removed from the probe until the external edge is about coplanar with the probe surface. The etching may then be continued.

Other probe adjustment mechanisms may be used in other embodiments to adjust the surface of the probe to be coplanar to the chamber surface, such as allowing the probe to be screwed further onto the shaft. Such probe adjustment mechanisms are preferably connected to the shaft, but may be performed through other devices. The spacers allow the external edge of the sleeve to be kept coplanar with the surface of the probe as the external edge of the sleeve and the surface of the probe erode at different speeds. Other sleeve adjustment mechanisms may be used in other embodiments to adjust the external edge of the sleeve to be kept coplanar with the surface of the probe. Such sleeve adjustment mechanisms are preferably disposed between the probe and the sleeve.

Figure 6:
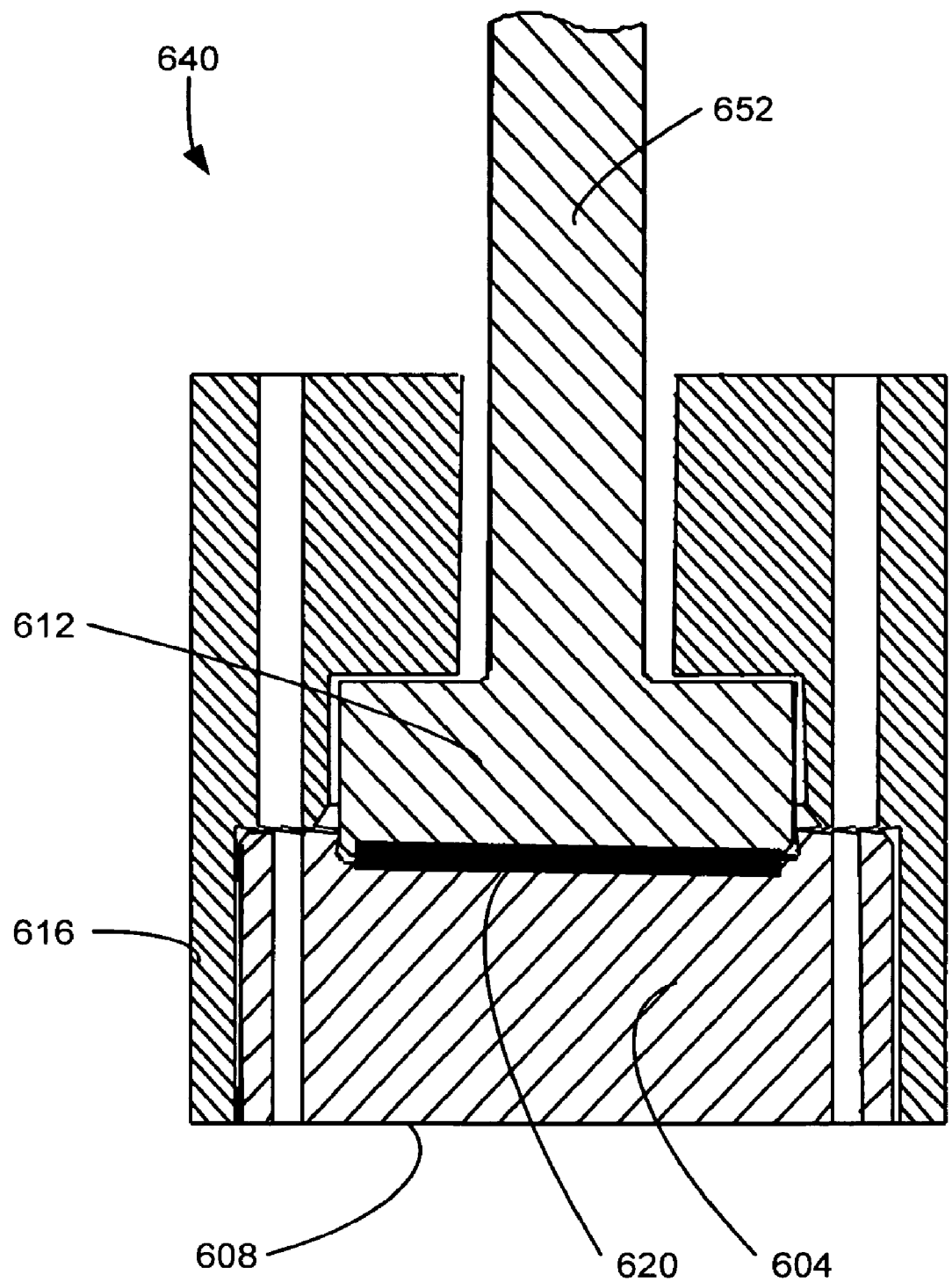
FIG. 6 is a cross-sectional view of another plasma probe.

FIG. 6 is a cross-sectional view of a probe 640 provided by another embodiment of the invention. The probe 640 comprises a probe element 604 with a probe surface 608. A wire mesh spring and an elastomer adhesive bond 620 electrically and mechanically connect a second end of the probe element 604 to an electrical connector 612. A support shaft 652 is connected to the electrical connector 612. An electrically insulative sleeve 616 surrounds the probe element 604 and the electrical connector 612. In an alternative embodiment, probe element 604 can be bonded to electrical connector 612 by brazing.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A plasma processing chamber, comprising:
   a chamber wall forming a plasma processing chamber enclosure;
   a substrate support for supporting a wafer within the plasma processing chamber enclosure;
   at least one electrode for providing power to the plasma processing chamber enclosure for sustaining a plasma;
   a gas inlet for providing gas into the plasma processing chamber enclosure;
   a gas outlet for exhausting gas from the plasma processing chamber enclosure; and
   a plasma probe assembly for measuring electrical characteristics of the plasma, comprising:
      a probe element with a probe surface at a first end of the probe element;
      an electrical connector electrically connected to the probe element;
      an electrically insulating sleeve surrounding at least part of the probe element; and
      an adjustment device connected to the probe element to adjust the probe element so that the probe surface is coplanar with an interior surface of the chamber wall.

2. The plasma processing chamber, as recited in claim 1, wherein the plasma probe assembly further comprises a wire mesh spring and elastomer adhesive electrically connecting the second end of the probe element to the electrical connector.

3. The plasma processing chamber, as recited in claim 1, wherein the plasma probe assembly further comprises a wire brazed to the probe element and brazed to the electrical connector.

4. The plasma processing chamber, as recited in claim 1, wherein the plasma probe assembly further comprises:
   a segmented cover surrounding the electrical connector and at least part of the probe element; and
   at least one O-ring surrounding the segmented cover.

5. The plasma processing chamber, as recited in claim 1, wherein the probe surface is silicon.

6. The plasma processing chamber, as recited in claim 1, wherein the plasma probe assembly further comprises sensing electronics electrically connected to the electrical connector, wherein the sensing electronics comprises an ammeter.

7. The plasma processing chamber, as recited in claim 1, wherein the electrically insulating sleeve is quartz.

8. The plasma processing chamber, as recited in claim 1, wherein the plasma probe assembly further comprises a sleeve adjustment device for adjusting the electrical insulating sleeve, wherein the electrically insulating sleeve has an external edge and the sleeve adjustment device adjusts the external edge to be coplanar to the probe surface.

9. The plasma processing chamber, as recited in claim 8, wherein the probe element is a semiconductor probe element, wherein the probe surface is a semiconductor probe surface.

10. The plasma processing chamber, as recited in claim 9, wherein the sleeve adjustment device comprises at least one removable spacer placed between the electrically insulating sleeve and the semiconductor probe element.

11. The plasma processing chamber, as recited in claim 10, wherein the plasma probe assembly further comprises:
   a segmented cover surrounding the electrical connector and at least part of the probe element; and
   at least one O-ring surrounding the segmented cover.

12. The plasma processing chamber, as recited in claim 11, wherein the plasma probe assembly further comprises a support shaft wherein the adjustment device is mechanically connected to the support shaft and moves the support shaft during adjustment.

13. The plasma processing chamber, as recited in claim 12, wherein the probe element comprises:

a first end with the probe surface;

a second end spaced apart from the first end; and a neck portion extending between the first end and the second end, wherein the neck portion has a cross-section that is smaller than a cross-section of the first end and a cross-section of the second end.

14. The plasma processing chamber, as recited in claim 13, wherein the insulating sleeve further comprises a lip, which forms an aperture through which the second end and the neck of the probe element are able to pass, but through which the first end of the probe element is not able to pass and wherein the at least one removable spacer is placed between the lip and a side of the first end of the probe element opposite from the probe surface.

15. The plasma processing chamber, as recited in claim 14, wherein the segmented cover, comprises:

a first lip that engages with the second end of the probe element; and a second lip that engages with the electrical connector, wherein the first lip and second lip force the second end of the probe element against the electrical connector.

16. The plasma processing chamber, as recited in claim 15, wherein the second lip has a surface with an oblique connection with the electrical conductor to force the second end of the probe element against the electrical connector.

17. The plasma processing chamber, as recited in claim 15, wherein the first lip has a surface with an oblique connection with the electrical conductor to force the second end of the probe element against the electrical connector.

18. A plasma processing chamber, comprising:

a chamber wall forming a plasma processing chamber enclosure;

a substrate support for supporting a wafer within the plasma processing chamber enclosure;

at least one electrode for providing power to the plasma processing chamber enclosure for sustaining a plasma;

a gas inlet for providing gas into the plasma processing chamber enclosure;

a gas outlet for exhausting gas from the plasma processing chamber enclosure; and a plasma probe assembly for measuring electrical characteristics of the plasma, comprising:

a semiconductor probe element with a semiconductor probe surface at a first end of the semiconductor probe element;

an electrical connector electrically connected to a second end of the semiconductor probe element;

an electrically insulating sleeve surrounding at least part of the probe element;

an adjustment device connected to the semiconductor probe element to adjust the semiconductor probe element so that the probe surface is coplanar with an interior surface of the chamber wall;

a sleeve adjustment device for adjusting the electrical insulating sleeve, wherein the electrically insulating sleeve has an external edge and the sleeve adjustment device adjusts the external edge to be coplanar to the probe surface; and sensing electronics electrically connected to the electrical connector, wherein the sensing electronics comprises an ammeter.

19. The plasma processing chamber, as recited in claim 18, wherein the probe surface is silicon.

20. The plasma processing chamber, as recited in claim 19, wherein the electrically insulating sleeve is quartz.

* * * * *